United States Patent [19]

Eames et al.

[11] Patent Number: 4,611,398

[45] Date of Patent: Sep. 16, 1986

[54] INTEGRATED CIRCUIT PACKAGE

[75] Inventors: Robert J. Eames, Warren, Pa.;
Richard E. Johnson, Jamestown, N.Y.

[73] Assignee: GTE Products Corporation, Stamford, Conn.

[21] Appl. No.: 659,212

[22] Filed: Oct. 9, 1984

[51] Int. Cl.⁴ .......................... H05K 3/30; H05K 1/18
[52] U.S. Cl. .................... 29/841; 174/52 FP; 357/70
[58] Field of Search .............. 29/840, 841, 588; 174/52 FP, 52 PE; 357/70, 74

[56] References Cited

U.S. PATENT DOCUMENTS

| 3,265,806 | 8/1966 | Burks et al. .................. 357/70 X |
| 3,651,434 | 3/1972 | McGrough et al. ....... 174/52 FP X |
| 3,684,818 | 8/1972 | Netherwood ..................... 357/74 X |
| 3,714,370 | 1/1973 | Nixen et al. ................ 174/52 FP X |
| 3,981,074 | 9/1976 | Yamamoto et al. ............... 357/70 X |
| 4,139,859 | 2/1979 | Lewis et al. ...................... 357/70 X |
| 4,285,002 | 8/1981 | Campbell .......................... 29/827 X |
| 4,499,333 | 2/1985 | Chee et al. ....................... 357/74 X |

Primary Examiner—Mack Rosenbaum
Assistant Examiner—Carl J. Arbes
Attorney, Agent, or Firm—William H. McNeill

[57] ABSTRACT

An integrated circuit package cover includes a groove with a quadrangular cross-section which contains a self-supporting sealant material of similar cross-section. During assembly, the sealant material is penetrated by the lead-ins and flows around them to achieve an environmental seal for the packaged chip.

3 Claims, 5 Drawing Figures

INTEGRATED CIRCUIT PACKAGE

TECHNICAL FIELD

This invention relates to integrated circuit packages and more particularly to novel sealing means therefor.

BACKGROUND ART

After an IC chip has been mounted on a lead frame chip carrier, and electrically connected to the leads thereof, it is often packaged in encapsulating material. Such packaged chip-containing lead frames are shown in, for example, the following U.S. Pat. Nos. 4,331,831; 4,301,464; 4,298,883; 4,264,917; 4,214,364; 4,132,856; 4,124,864; 4,079,511; 3,978,516; 3,793,474; 3,684,464; 3,659,821; 3,611,061; 3,436,810; and U.S. patent application Ser. No. 584,080; filed Feb. 27, 1984, the teachings of which are herein incorporated by reference.

As pointed out in the above, the lead frames are usually made by stamping or etching metal strips. Where the manufactured quantities are sufficiently great, stamping is preferred because of its lower cost.

As the circuits on the chips become more complex, a greater number of leads per lead frame is required. This complicates the stamping operation. Stamping is carried out in progressive dies; that is, a metal strip is fed through a stamping press having successive punch and die sets at a number of stations, where successive stamping operations are carried out. For example, a lead frame having 68 leads would require about 15 to 20 stamping stations and about 140 to 150 cuts. As the number of required stamping stations and cuts increases, the difficulty in maintaining adequate quality of the stamped lead frames also increases.

As taught in the above-mentioned patent application Ser. No. 584,080, these assemblies are prepared by securely attached a plurality of lead-ins to a base and then fixing an integrated circuit chip on the base relative to the lead-ins. Appropriate electrical connections are made between the lead-ins and the chip and a cover is placed thereover and fixed thereto. The cover contains a central depression to accommodate the chip and is provided with an annular groove, semi-cylindrical in cross-section, for receiving a fluid sealant. The base is provided with a matching groove and either the cover or the base, usually the cover, is provided with apertures which communicate with the groove so the sealant material can be injected into the groove. The injection of the sealant material requires an extra processing step that adds to the cost of the package.

DISCLOSURE OF THE INVENTION

It is, therefore, an object of the invention to obviate the disadvantages of the prior art.

It is another object of the invention to enhance the fabrication of integrated circuit packages.

It is yet another object of the invention to reduce the cost of making integrated circuit packages.

These objects are accomplished, in one aspect of the invention, by the provision of a cover for an integrated circuit package, the cover containing, on an inner surface thereof, an annular groove which is rectangular in cross-section.

The cover contains, within the groove, a self-supporting, lead-in deformable sealant washer which has a cross-section matching the groove.

To fabricate the integrated circuit package, a plurality of electrically conductive lead-ins are attached to an electrically insulating base. An integrated circuit chip is then affixed to the base and electrical connections made between the chip and the lead-ins. A self-supporting, lead-in deformable sealant washer is fitted into an annular groove in an electrically insulating cover and the cover is then mounted upon the base, whereby the plurality of lead-ins penetrate the washer.

Employment of this cover, seal and method reduces the number of steps involved in the package manufacture and enhances the package while reducing the cost.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
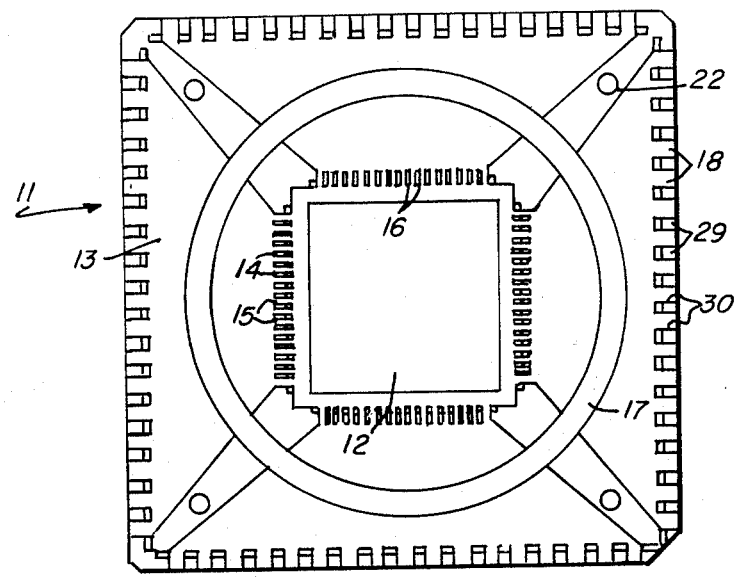
FIG. 1 is a plan view of a base for an integrated circuit package.

Referring now to the drawings with greater particularity, there is shown in FIG. 1 a base 11, made of a high temperature thermoplastic material, such as a polyetherimide resin made by General Electric Co., Pittsfield, Mass., under the trade name Ultem. In the center of base 11 is a recess 12 in which an IC chip is eventually disposed. Surrounding recess 12 are raised projections 14. Spaces 15 exist between the projections 14. On the inner end of each projection 14 is another raised portion 16. Raised portions 16 provided means for securing the leads in spaces 15 as shown in the above-described Ser. No. 584,080. There is an encircling trough 17 outside the perimeter formed by all the projections 14, the trough being rectangular in cross-section.

At the periphery of support 11 there are additional slots 18 for the outer portions of the lead-ins. Slots 18 are formed by projections 29 which are similar to projections 14 but bigger. There are raised portions 30 on the inner ends of projections 29, similar to raised portions 16 on projections 14. There are four posts 22 on base 11 for accurate mating of base 11 with cover 23, which is made of the same plastic as support 11.

Figure 2:
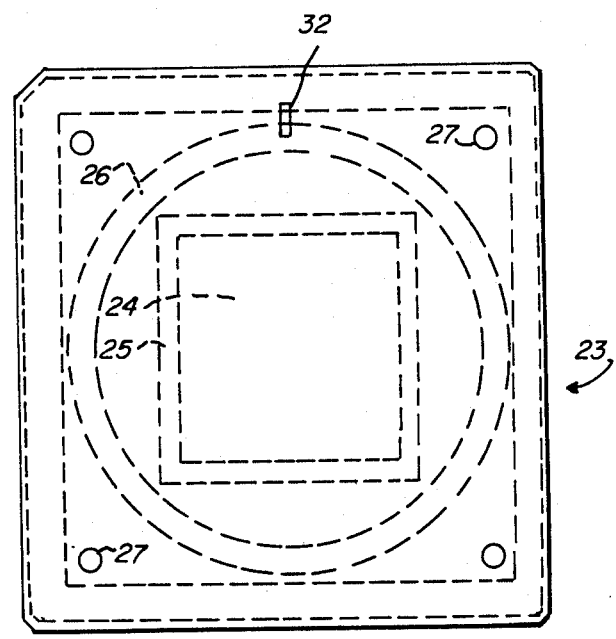
FIG. 2 is a plan view of a cover for the base of FIG. 1, on and enlarged scale.
Figure 3:
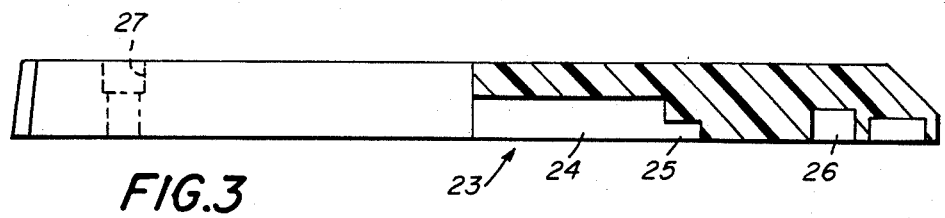
FIG. 3 is an elevational view, partly in section, of the cover of FIG. 2.

Cover 23 (FIGS. 2 and 3 ) has a recess 24 to mate with recess 12, and has an additional recess 25 to accommodate projections 14. Cover 23 also has a groove 26 rectangular in cross-section, to mate with trough 17, and four holes 27 into which posts 22 fit.

Figure 4:
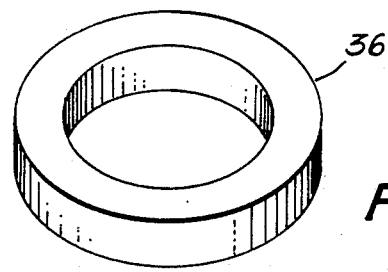
FIG. 4 is a perspective view of a sealant washer.

A self-supporting, lead-in deformable sealant washer 36 (FIG. 4) quadrangular in cross-section to match the configuration of groove 26 and trough 17, is provided within groove 26. Washer 36 is preferably formed from Amicon SE-617 or SE-628.

Assembly of the components proceeds as follows. Four lead frame segments would be placed on top of base 11, one at a time and one in each quadrant, as shown in Ser. No. 584,080. Each segment is carefully positioned so that the internal ends lay in spaces 15 and the external ends lay in slots 18. Pressure is then applied to the segments to ensure that they are flush against surface 13 and then, maintaining the pressure, heat is applied to portions 16 and 30 to cause them to flow over, and secure in place the internal ends and the external ends of the leads. This construction ensures accurate positioning, with secure attachment, of all of the leads with excellent co-planarity thereof.

Next, an IC chip would be conventionally attached in the pad area, recess 12, and would be conventionally electrically connected to the internal ends of the lead-ins. The external ends of leads 4 can now be formed into a desired shape, such as "J" lead shape 34 showin in FIG. 5.

Washer 36 is then placed in groove 26 of cover 23 and cover 23 is placed on support 11, posts 22 fitting into holes 27. Holes 27 are counterbored about half-way through as shown in FIG. 7, for example, to 43 mils diameter from 33 mile diameter. Posts 22 extend somewhat in the counterbores of holes 27, thereby providing the means for securing cover 23 to base 11 by heat-flowing the extending upper ends of posts 27, as raised portions 16 and 30 were heat-flowed.

As cover 23 is pressed upon base 11, the lead-ins penetrate the washer 36. The excess material of washer 36; i.e., that which rises above the surface of cover 23, flows into trough 17 in base 11.

Figure 5:
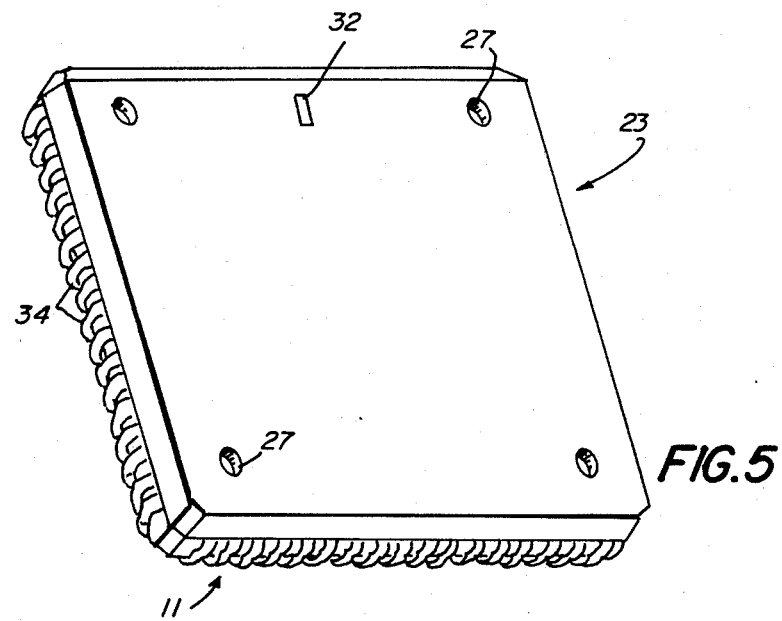
FIG. 5 is a perspective view of a completed integrated circuit package.

To complete the package, a lead identifier 32 may be used, as shown in FIG. 5.

Employment of this invention eliminates a difficult and time consuming process step in package manufacture and reduces the cost.

While there have been shown and described what are at present considered to by the preferred embodiments of the invention, it will be apparent to those skilled in the art that various changes and modifications can be made herein without departing from the scope of the invention as defined by the appended claims.

We claim:

1. A cover for an integrated circuit package, said cover comprising: and electrically insulating body having an outer surface and an inner surface; said inner surface having a substantially centrally located quadrangular depression therein; and an annular groove formed in said inner surface and circumscribing said depression, said annular groove having a minimum diameter greater than the largest diagonal measurement of said depression; and said groove being quadrangular in cross-section.

2. The cover of claim 1 wherein said annular groove contains a self-supporting, lead-in deformable sealant washer having a cross-section matching the cross-section of said annular groove.

3. A method of fabricating and integrated circuit package comprising the steps of: attaching a plurality of electrically conductive lead-ins to an electrically insulating base; fixing and integrated circuit chip to said base; making electrical connections between said chip and said lead-ins; providing a insulating cover having and inner surface facing said insulating base; fixing a self-supporting, lead-in deformable sealant washer into an annular groove formed in the inner surface of the electrically insulating cover; and mounting said cover upon said base whereby said plurality of lead-ins penetrate said washer.

* * * * *